(12) United States Patent
Wu et al.

(10) Patent No.: US 10,431,710 B2
(45) Date of Patent: Oct. 1, 2019

(54) LIGHT EMITTING DEVICE

(71) Applicant: PLAYNITRIDE INC., Tainan (TW)

(72) Inventors: Jyun-De Wu, Tainan (TW); Shen-Jie Wang, Tainan (TW); Yen-Lin Lai, Tainan (TW)

(73) Assignee: PLAYNITRIDE INC., Tainan (TW)

( * ) Notice: Subject to any disclaimer, the term of this patent is extended or adjusted under 35 U.S.C. 154(b) by 5 days.

(21) Appl. No.: 15/660,070

(22) Filed: Jul. 26, 2017

(65) Prior Publication Data

US 2018/0351032 A1 Dec. 6, 2018

(30) Foreign Application Priority Data

Jun. 1, 2017 (TW) .............................. 106118151 A

(51) Int. Cl.
| | |
|---|---|
| *H01L 33/12* | (2010.01) |
| *H01L 33/00* | (2010.01) |
| *H01L 33/06* | (2010.01) |
| *H01L 33/02* | (2010.01) |
| *H01L 33/32* | (2010.01) |
| *H01L 33/14* | (2010.01) |
| *H01L 33/38* | (2010.01) |

(52) U.S. Cl.
CPC ........ *H01L 33/0025* (2013.01); *H01L 33/025* (2013.01); *H01L 33/06* (2013.01); *H01L 33/12* (2013.01); *H01L 33/14* (2013.01); *H01L 33/32* (2013.01); *H01L 33/382* (2013.01)

(58) Field of Classification Search
CPC . H01L 33/0025; H01L 33/382; H01L 33/025; H01L 33/00–346
See application file for complete search history.

(56) References Cited

U.S. PATENT DOCUMENTS

| | | | |
|---|---|---|---|
| 8,816,319 B1* | 8/2014 | Raring | .................... H01L 33/06 257/13 |
| 9,680,056 B1* | 6/2017 | Zhang | ................. H01L 33/0025 |
| 2007/0187697 A1* | 8/2007 | Wu | ......................... B82Y 20/00 257/79 |
| 2011/0140083 A1* | 6/2011 | Driscoll | ............. H01L 21/0237 257/15 |
| 2011/0198634 A1* | 8/2011 | Sasaki | ................. H01L 33/0066 257/94 |

(Continued)

*Primary Examiner* — Eric A. Ward
*Assistant Examiner* — Eric K Ashbahian
(74) *Attorney, Agent, or Firm* — Maschoff Brennan

(57) ABSTRACT

A light emitting device includes an epitaxial structure. The epitaxial structure includes a first type semiconductor layer, a second type semiconductor layer and a light emitting layer. The first type semiconductor layer includes a first semiconductor sublayer. The light emitting layer is disposed between the first type semiconductor layer and the second type semiconductor layer. The first semiconductor sublayer includes a heavily doped part and a lightly doped part which are doped by a first type dopant. A doping concentration of the first type dopant in the heavily doped part is equal to $10^{18}$ atoms/cm$^3$ or between $10^{17}$ atoms/cm$^3$ and $10^{18}$ atoms/cm$^3$. A doping concentration of the first type dopant in the lightly doped part is less than or equal to $10^{17}$ atoms/cm$^3$.

25 Claims, 10 Drawing Sheets

(56) References Cited

U.S. PATENT DOCUMENTS

| | | | |
|---|---|---|---|
| 2012/0223355 A1* | 9/2012 | Asakawa | H01L 33/38 257/99 |
| 2012/0326169 A1* | 12/2012 | Sakai | B82Y 20/00 257/79 |
| 2013/0112943 A1* | 5/2013 | Tanaka | H01L 33/06 257/13 |
| 2013/0146839 A1* | 6/2013 | Nakamura | H01L 33/04 257/13 |
| 2015/0030046 A1* | 1/2015 | Aoki | H01L 33/025 372/45.012 |
| 2015/0083990 A1* | 3/2015 | Fu | H01L 33/06 257/13 |
| 2015/0155273 A1* | 6/2015 | Nakajima | H01L 29/41725 257/76 |
| 2017/0207303 A1* | 7/2017 | Lin | H01L 29/151 |

* cited by examiner

LIGHT EMITTING DEVICE

CROSS-REFERENCE TO RELATED APPLICATIONS

This non-provisional application claims priority under 35 U.S.C. § 119(a) on Patent Application No(s). 106118151 filed in Taiwan, R.O.C. on Jun. 1, 2017, the entire contents of which are hereby incorporated by reference.

TECHNICAL FIELD

The disclosure relates to a light emitting device, more particularly to a light emitting device with a heavily doped part and a lightly doped part.

BACKGROUND

The light emitting diode (LED) is widely used in many fields as a light emitting device with high luminous efficiency. The conventional manufacturing method of the light emitting diode is the epitaxial method. An N-type semiconductor layer, a light emitting layer, and a P-type semiconductor layer are formed on a substrate in sequence so as to obtain an epitaxial structure of the light emitting diode.

SUMMARY

According to an embodiment of the present disclosure, a light emitting device includes an epitaxial structure. The epitaxial structure includes a first type semiconductor layer, a second type semiconductor layer, and a light emitting layer. The first type semiconductor layer includes a first semiconductor sublayer. The light emitting layer is disposed between the first type semiconductor layer and the second type semiconductor layer. The first semiconductor sublayer has a heavily doped part and a lightly doped part which are doped by a first type dopant. A doping concentration of the first type dopant in the heavily doped part is equal to $10^{18}$ atoms/cm$^3$ or between $10^{17}$ atoms/cm$^3$ and $10^{18}$ atoms/cm$^3$, and a doping concentration of the first type dopant in the lightly doped part is less than or equal to $10^{17}$ atoms/cm$^3$.

BRIEF DESCRIPTION OF THE DRAWINGS

The present disclosure will become better understood from the detailed description given hereinbelow and the accompanying drawings which are given by way of illustration only and thus are not limitative of the present disclosure and wherein.

DETAILED DESCRIPTION

Figure 1:
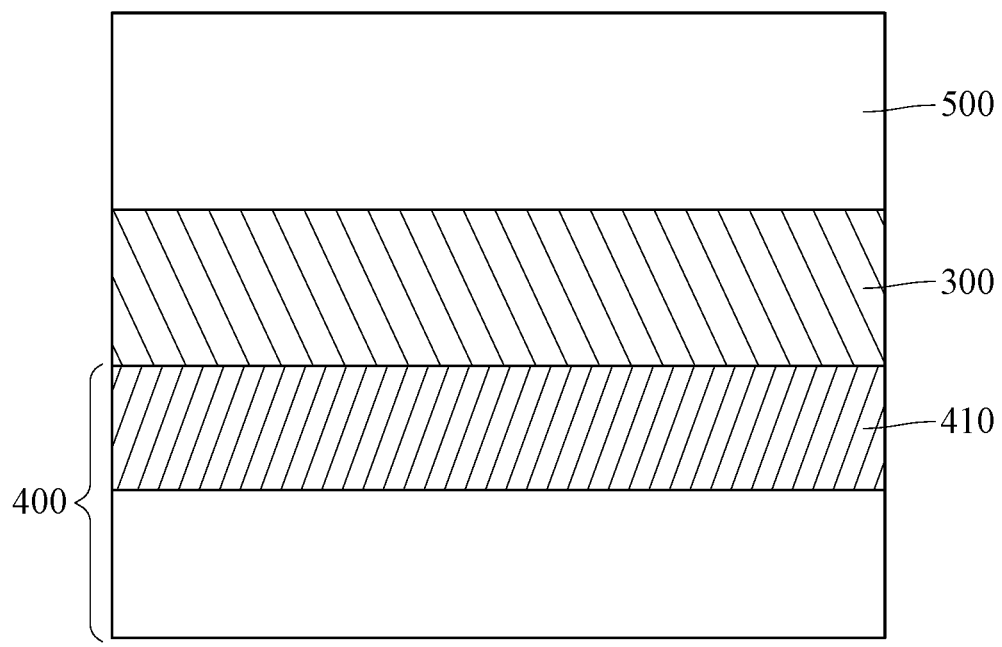
FIG. 1 is a cross-sectional view of a light emitting device in a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
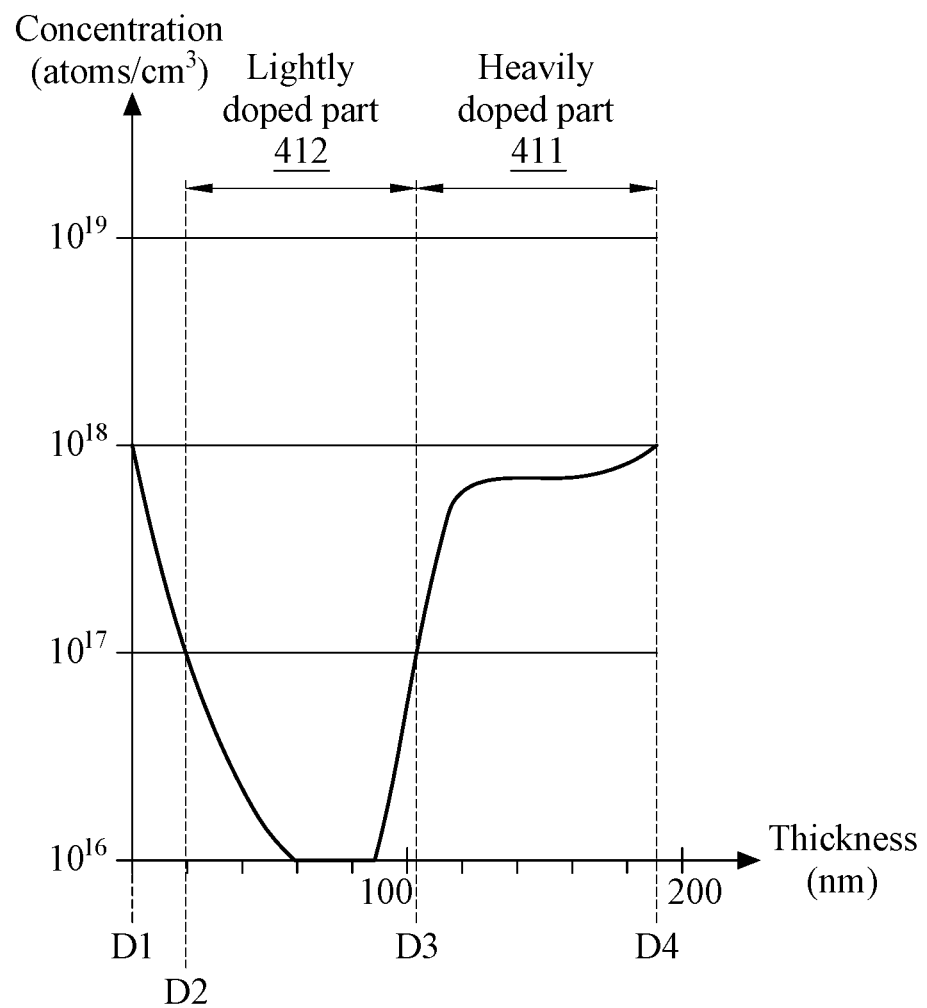
FIG. 2 is a schematic view of a doping concentration distribution of an epitaxial structure in the first embodiment of the present disclosure.

First, a light emitting device 1 in the first embodiment of the present disclosure is illustrated. Please refer to FIG. 1 and FIG. 2. FIG. 1 is a cross-sectional view of a light emitting device in a first embodiment of the present disclosure. FIG. 2 is a schematic view of a doping concentration distribution of an epitaxial structure in the first embodiment of the present disclosure. In the first embodiment of the present disclosure, the light emitting device 1 includes an epitaxial structure. The epitaxial structure includes a first type semiconductor layer 400, a second type semiconductor layer 500, and a light emitting layer 300 disposed between the first type semiconductor layer 400 and the second type semiconductor layer 500. A thickness T of the epitaxial structure is, for example, less than 6 micrometers (μm), and the thickness T of the epitaxial structure is, for example, greater than 1 μm. Either overly thick or overly thin thickness T of the epitaxial structure is unfavorable for the yield of the following manufacturing process. A maximum width of the light emitting device 1 is from 1 μm to 100 μm and the maximum width thereof is, for example, 3 μm to 30 μm which means the light emitting device 1 in the first embodiment is a micro LED in micron level.

The first type semiconductor layer 400 and the second type semiconductor layer 500 are doped by different type dopant. For example, in the first type semiconductor layer 400, the primary dopant is a first type dopant. The first type dopant includes Group IV elements such as silicon (Si), carbon (C), or germanium (Ge). Therefore, the first type semiconductor layer 400 is an N-type semiconductor layer. In the second type semiconductor layer 500, the primary dopant is a second type dopant. The second type dopant includes Group II elements such as magnesium (Mg). Therefore, the second type semiconductor layer 500 is a P-type semiconductor layer. The following illustrates the light emitting device 1 in the first embodiment of the present disclosure, wherein the first type semiconductor layer 400 is the N-type semiconductor layer, and the second type semiconductor layer 500 is the P-type semiconductor layer.

The light emitting layer 300, for example, is an active layer with multiple quantum well (MQW) structure. The light emitting layer 300 is made by $In_yGa_{1-y}N$, where $0 \le y < 1$. In the first embodiment of the present disclosure, the light emitting layer 300 includes the MQW structure which includes a plurality of indium gallium nitride (InGaN) layers and a plurality of gallium nitride (GaN) layers, but the present disclosure is not limited thereto. The thickness of the light emitting layer 300 is from 0.1 μm to 1 μm, but the present disclosure is not limited thereto.

The first type semiconductor layer 400 includes a first semiconductor sublayer 410. The first semiconductor sublayer 410 is made by a ternary semiconductor material such as $In_xGa_{1-x}N$, where 0<X<1, but the present disclosure is not limited thereto. The thickness of the first semiconductor sublayer 410, for example, is from 50 nanometers (nm) to 250 nm, but the present disclosure is not limited thereto. An overly thick first semiconductor sublayer 410 is unfavorable for the epitaxial quality. In the first embodiment of the present disclosure, the first semiconductor sublayer 410 is made by indium gallium nitride (InGaN), which shows better stress release effect than other materials. The thickness of the first semiconductor sublayer 410 is 200 nm. In other embodiments of the present disclosure, the thickness of the first semiconductor sublayer is 75 nm, 100 nm, 150 nm, or 225 nm.

In the first embodiment of the present disclosure, the first semiconductor sublayer 410 is a single layer. In detail, in an image of an electron microscope or a secondary ion mass spectrometry (SIMS), heavily doped part and lightly doped part in the first semiconductor sublayer 410 show consistent grayscale level.

In the first embodiment of the present disclosure, the doping concentration distribution of the first type dopant in the first semiconductor sublayer 410 is illustrated in FIG. 2. The first semiconductor sublayer 410 has at least one heavily doped part 411 and at least one lightly doped part 412 which are doped by the first type dopant. The first type dopant is the primary dopant in the first semiconductor sublayer 410. The doping concentration of the first type dopant in the lightly doped part 412 ($C_L$) is smaller than or equal to $10^{17}$ atoms/cm$^3$ in the first embodiment of the present disclosure. Preferably, in some other embodiments of the present disclosure, $C_L$ is smaller than or equal to $5 \times 10^{16}$ atoms/cm$^3$. More preferably, in yet other embodiments of the present disclosure, $C_L$ is smaller than or equal to $10^{16}$ atoms/cm$^3$. In still other embodiments of the present disclosure, the lightly doped part 412 approaches undoped, which means $C_L$ of the lightly doped part is less than the minimum detectable concentration of SIMS. The doping concentration of the first type dopant in the heavily doped part 411 ($C_H$) is greater than $10^{17}$ atoms/cm$^3$, but $C_H$ is smaller than or equal to $10^{18}$ atoms/cm$^3$ in the first embodiment of the present disclosure. Preferably, in some other embodiments of the present disclosure, $C_H$ is greater than $5 \times 10^{17}$ atoms/cm$^3$, but $C_H$ is smaller than or equal to $10^{18}$ atoms/cm$^3$. More preferably, in yet other embodiments of the present disclosure, $C_H$ is greater than $8 \times 10^{17}$ atoms/cm$^3$, but $C_H$ is smaller than or equal to $10^{18}$ atoms/cm$^3$.

In the first embodiment of the present disclosure, a ratio of the doping concentration of the first type dopant in the heavily doped part 411 to the doping concentration of the first type dopant in the lightly doped part 412 ($C_H/C_L$) is greater than 10. In some other embodiments of the present disclosure, $C_H/C_L$ is greater than or equal to $10^2$. The ratio of the doping concentration of the first type dopant in the heavily doped part 411 to the doping concentration of the first type dopant in the lightly doped part 412 ($C_H/C_L$) is, for example, the highest doping concentration of the first type dopant in the heavily doped part 411 to the lowest doping concentration of the first type dopant in the lightly doped part 412. With the great doping concentration difference between the heavily doped part 411 and the lightly doped part 412, the stress generated in the epitaxial structure is reduced during the epitaxy. In the light emitting device of first embodiment of the present disclosure, the first type semiconductor layer 400 is the N-type semiconductor layer, and the first type dopant is silicon, but the present disclosure is not limited thereto.

In the first embodiment of the present disclosure, the lightly doped part 412 is disposed between the heavily doped part 411 and the light emitting layer 300, but the present disclosure is not limited thereto. In other embodiments of the present disclosure, the heavily doped part is disposed between the lightly doped part and the light emitting layer.

In the first embodiment of the present disclosure, the number of the heavily doped part and the lightly doped part are one. In a direction perpendicular to the epitaxy direction of the light emitting device 1, the heavily doped part 411 is covered by the lightly doped part 412, which means that the lightly doped part 412 and the heavily doped part 411 are formed in different stage during the epitaxial process of the first semiconductor sublayer 410, but the present disclosure is not limited thereto. In the first embodiment of the present disclosure, a direction away from the light emitting layer 300 originated from a surface of the first type semiconductor layer 400, which is in contact with the light emitting layer 300, is taken as the origin. A part from the thickness D1 to the thickness D4 corresponds to the first type semiconductor layer 400. A part from the thickness D2 to the thickness D3 corresponds to the lightly doped part 412. A part from the thickness D3 to the thickness D4 corresponds to the heavily doped part 411. The lightly doped part 412 is disposed between the heavily doped part 411 and the light emitting layer 300, but the present disclosure is not limited thereto. In other embodiments of the present disclosure, the heavily doped part 411 is disposed between the lightly doped part 412 and the light emitting layer 300.

In the first embodiment of the present disclosure, the thickness (D2-D3) of the lightly doped part 412 is 10% to 95% of the thickness (D1-D4) of the first semiconductor sublayer 410. Preferably, in some other embodiments of the present disclosure, the thickness of the lightly doped part 412 is 60% to 95% of the thickness of the first semiconductor sublayer 410. More preferably, in yet other embodiments of the present disclosure, the thickness of the lightly doped part 412 is 80% to 95% of the thickness of the first semiconductor sublayer 410. The ratio of the thickness of the lightly doped part 412 to the thickness of the first semiconductor sublayer 410 is higher, the light emitting device 1 in the present disclosure shows better electrical performance. In other embodiments of the present disclosure, the first semiconductor sublayer has a plurality of heavily doped parts and a plurality of lightly doped parts, and the plurality of heavily doped parts and the plurality of lightly doped parts are disposed in an alternative order as a multi-layer structure. A total thickness of the lightly doped part is 10% to 95% of the thickness of the first semiconductor sublayer. Preferably, in some other embodiments of the present disclosure, a total thickness of the lightly doped part is 60% to 95% of the thickness of the first semiconductor sublayer. More preferably, in yet other embodiments of the present disclosure, a total thickness of the lightly doped part is 80% to 95% of the thickness of the first semiconductor sublayer.

The second type semiconductor layer 500 is disposed at a side of the light emitting layer 300 away from the first type semiconductor layer 400. The material of the second type semiconductor layer 500 includes III-V nitrides such as gallium nitride (GaN), aluminum nitride (AlN) indium nitride (InN), indium gallium nitride (InGaN), aluminum gallium nitride (AlGaN), or indium gallium aluminum nitride (AlInGaN). The material of the second type semiconductor layer 500 in the first embodiment of the present disclosure is gallium nitride (GaN) or aluminum gallium nitride (AlGaN). The second type dopant is the primary dopant in the second type semiconductor layer 500. In the first embodiment of the present disclosure, the second type semiconductor layer 500 is a P-type semiconductor layer, and the second type dopant is magnesium, but the present disclosure is not limited thereto.

Since both the heavily doped part 411 and the lightly doped part 412 are simultaneously in the first semiconductor sublayer 410 showing a single layer structure, and there is a great doping concentration difference between the heavily doped part 411 and the lightly doped part 412, the interference in the lattice orientation of the lightly doped part 412 caused by the dopant is less than the interference in the lattice orientation of the heavily doped part 411 caused by the dopant. As a result, the stress accumulated in the lattice of the lightly doped part 412 is smaller than the stress accumulated in the lattice of the heavily doped part 411, and the accumulated stress in the epitaxial structure is buffered and released in the lightly doped part 412 of the first semiconductor sublayer 410; therefore, the continuous stress accumulation in the light emitting layer 300 is prevented. The higher the ratio of the thickness of the lightly doped part 412 to the thickness of the first semiconductor sublayer 410 is, the better the stress buffering and releasing effect of the lightly doped part 412 is. By disposing the lightly doped part 412 in the first semiconductor sublayer 410, defects resulted from the stress accumulation in the light emitting layer 300 is reduced, and, for example, the defect concentration in the light emitting layer 300 is from $10^4/cm^2$ to $10^8/cm^2$. Therefore, the emission uniformity, the emission intensity, and the breakdown voltage of the light emitting device 1 are improved, and the current leakage of the light emitting device 1 is reduced, so that the general electrical performance and the reliability of the light emitting device are improved.

Figure 3:
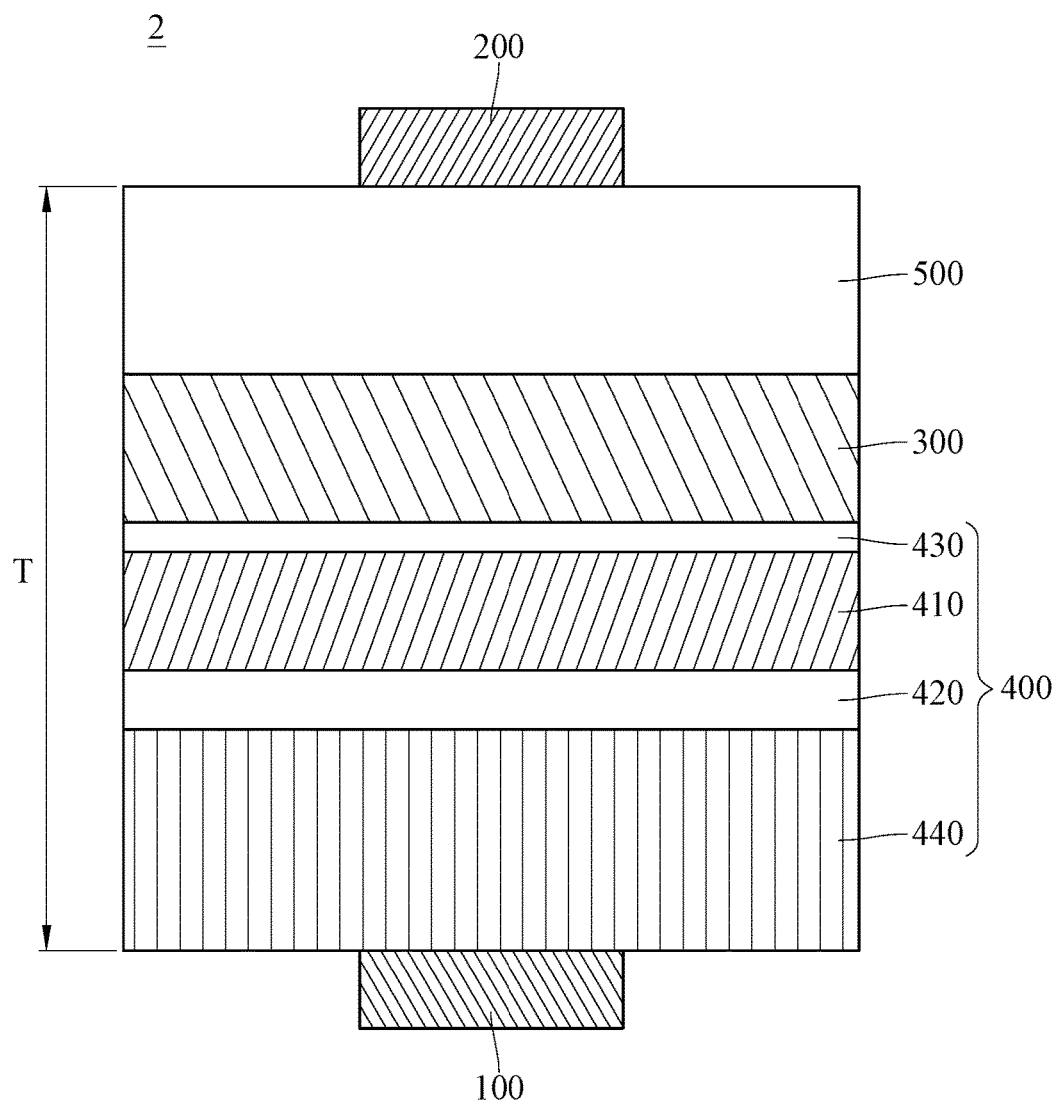
FIG. 3 is a cross-sectional view of a light emitting device in a second embodiment of the present disclosure.
Figure 4:
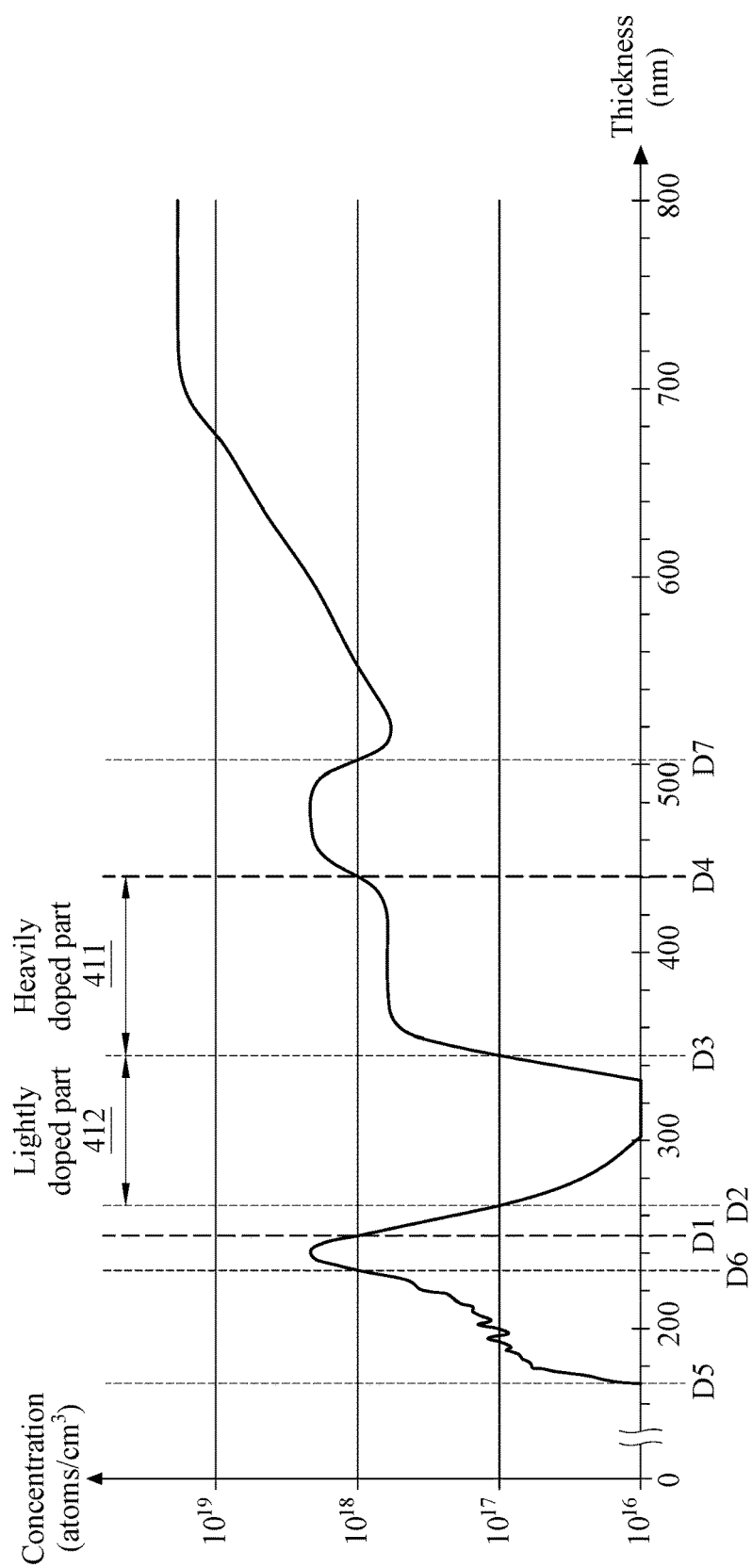
FIG. 4 is a schematic view of a doping concentration distribution of an epitaxial structure in the second embodiment of the present disclosure.
Figure 5:
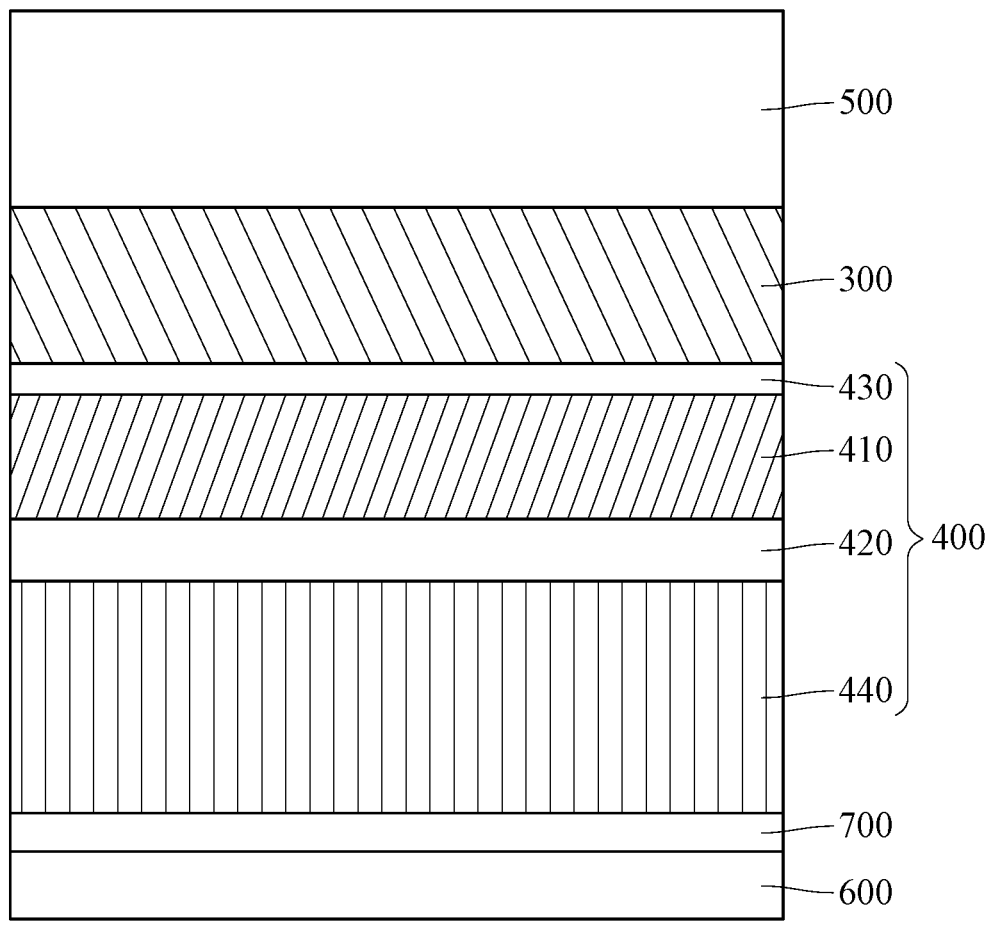
FIG. 5 is a cross-sectional view of the epitaxial structure and a substrate in the second embodiment of the present disclosure.

The following illustrates the light emitting device 2 in the second embodiment of the present disclosure. Please refer to FIG. 3 to FIG. 5. FIG. 3 is a cross-sectional view of a light emitting device in a second embodiment of the present disclosure. FIG. 4 is a schematic view of a doping concentration distribution of an epitaxial structure in the second embodiment of the present disclosure. FIG. 5 is a cross-sectional view of an epitaxial structure and a substrate in the second embodiment of the present disclosure. The light emitting device 2 includes a first electrode 100, a second electrode 200, and an epitaxial structure disposed between the first electrode 100 and the second electrode 200. The first electrode 100 and the second electrode 200, for example, are metal with high work function such as platinum, nickel, titanium, gold, chromium, silver, their compound or the combination thereof, metal oxide such as indium tin oxide or zinc oxide, or conductive non-metal material such as conductive polymer, graphite, graphene or black phosphorus. The metal with high work function is the metal with the work function higher than or equal to 4.5 eV. In the second embodiment of the present disclosure, the light emitting device 2 is a vertical light emitting device, and the epitaxial structure is disposed between the first electrode 100 and the second electrode 200, but the present disclosure is not limited thereto. In other embodiments of the present disclosure, the light emitting device is a lateral light emitting device or other type light emitting device. A maximum width of the light emitting device 2 is from 1 μm to 100 μm, and the maximum width thereof is preferred to be 3 μm to 30 μm, which means the light emitting device 2 in the second embodiment is a micro LED in micron level. Moreover, in the second embodiment of the present disclosure, a maximum peak current density of an external quantum efficiency curve of the light emitting device 2, for example, is from 0.01 $A/cm^2$ to 2 $A/cm^2$, which means the light emitting device in the present disclosure is suitable for operating under a low current density.

Please refer to FIG. 3, the epitaxial structure includes a light emitting layer 300, a first type semiconductor layer 400 disposed between the light emitting layer 300 and the first electrode 100, and the second type semiconductor layer 500 disposed between the light emitting layer 300 and the second electrode 200. A thickness T of the epitaxial structure is, for example, less than 6 μm, and the thickness T of the epitaxial structure is, for example, greater than 1 μm. The thickness of the epitaxial structure being too thick and too thin affects the yield of the following manufacturing process. The following illustrates the light emitting device 2 in the second embodiment of the present disclosure, wherein the first electrode 100 is a N-type electrode, and the second electrode 200 is a P-type electrode, and the first type semiconductor layer 400 is the N-type semiconductor layer, and the second type semiconductor layer 500 is the P-type semiconductor layer. Since the light emitting layer 300 in the second embodiment of the present disclosure is similar to the light emitting layer 300 in the first embodiment of the present disclosure, the illustration related to the light emitting layer 300 is not repeated hereafter.

The first type semiconductor layer 400 includes a first semiconductor sublayer 410, a second semiconductor sublayer 420, a carrier supply layer 430 and a current diffusion layer 440. The second semiconductor sublayer 420 is disposed between the first electrode 100 and the first semiconductor sublayer 410. The carrier supply layer 430 is disposed between the light emitting layer 300 and the first semiconductor sublayer 410. The current diffusion layer 440 is disposed at a side of the second semiconductor sublayer 420 away from the first semiconductor sublayer 410.

The material of the first semiconductor sublayer 410 is similar to the material of the first semiconductor sublayer 410 in the first embodiment of the present disclosure so that the illustration related to the material of the light emitting layer 300 is not repeated hereafter. The doping concentration of the first type dopant in the light emitting device 2 in the second embodiment of the present disclosure is shown in FIG. 4. The first semiconductor sublayer 410 has at least one heavily doped part 411 and at least one lightly doped part 412. In the second embodiment of the present disclosure, a direction away from the light emitting layer 300 originated from a surface of the first type semiconductor layer 400, which is in contact with the light emitting layer 300, is taken as the origin. A part from the thickness D1 to the thickness D4 corresponds to the first type semiconductor layer 400. A part from the thickness D2 to the thickness D3 corresponds to the lightly doped part 412. A part from the thickness D3 to the thickness D4 corresponds to the heavily doped part 411. A part from the thickness D5 to the thickness D6 corresponds to the light emitting layer 300. A part from the thickness D6 to the thickness D1 corresponds to the carrier supply layer 430. A part from the thickness D4 to the thickness D7 corresponds to the second semiconductor sublayer 420. A part from the thickness D7 toward a direction away from the thickness D4 corresponds to the current diffusion layer 440.

In the second embodiment of the present disclosure, the heavily doped part 411 is disposed between the lightly doped part 412 and the second semiconductor sublayer 420, but the present disclosure is not limited thereto. In other embodiments of the present disclosure, the lightly doped part is disposed between the heavily doped part and the second type semiconductor layer. The doping concentration and the thickness regarding to the heavily doped part 411 and the lightly doped part 412 in the second embodiment of the present disclosure are similar to the doping concentration and the thickness regarding to the heavily doped part 411 and the lightly doped part 412 in the first embodiment of the present disclosure, respectively, so that the doping concentration and the thickness regarding to the heavily doped part 411 and the lightly doped part 412 are not repeated hereafter.

The second semiconductor sublayer 420 is disposed between the first electrode 100 and the first semiconductor sublayer 410. The material of the second semiconductor sublayer 420, for example, is $Al_rIn_sGa_{1-r-s}N$, where r≥0, s≥0 and 1≥r+s≥0, but the present disclosure is not limited thereto. The thickness of the second semiconductor sublayer 420 is, for example, from 50 nm to 100 nm, but the present disclosure is not limited thereto. In the second embodiment of the present disclosure, the material of the second semiconductor sublayer 420 is gallium nitride (GaN), and the thickness of the second semiconductor sublayer 420 is 80 nm. In other embodiments of the present disclosure, the material of the second semiconductor sublayer is InGaN, AlGaN, or AlInGaN. The second semiconductor sublayer 420, for example, is a single layer structure.

The dopant in the second semiconductor sublayer 420 includes the first type dopant. In the second embodiment of the present disclosure, the second semiconductor sublayer 420 is a N-type semiconductor layer, and the first type dopant is silicon, but the present disclosure is not limited thereto. The doping concentration of the first type dopant in the second semiconductor sublayer 420 ($C_S$) is greater than the doping concentration of the first type dopant in the heavily doped part 411 ($C_H$). In detail, the doping concentration of the first type dopant in the second semiconductor sublayer 420 ($C_S$) is greater than $10^{18}$ atoms/cm$^3$, and $C_S$ is smaller than or equal to $10^{20}$ atoms/cm$^3$ in the second embodiment of the present disclosure. Preferably, in other embodiments of the present disclosure, $C_S$ is greater than $10^{18}$ atoms/cm$^3$, and $C_S$ is smaller than or equal to $10^{19}$ atoms/cm$^3$. In the second embodiment of the present disclosure, the location of the second semiconductor sublayer 420 corresponds to the part from the thickness D4 to the thickness D7 in FIG. 4. Since $C_S$ is greater than $C_H$, the number of the carriers in the first type semiconductor layer 400 is increased by the second semiconductor sublayer 420 so that the emission intensity of the light emitting layer 300 is further increased.

The carrier supply layer 430 is disposed between the light emitting layer 300 and the first semiconductor sublayer 410. The material of the carrier supply layer 430 is, for example, $Al_rIn_sGa_{1-r-s}N$, where r≥0, s≥0 and 1≥r+s≥0, but the present disclosure is not limited thereto. The thickness of the carrier supply layer 430 is, for example, from 10 nm to 30 nm, and an overly thick carrier supply layer 430 will increase the number of defects generated in the semiconductor layer formed by epitaxy subsequent to the formation of the carrier supply layer 430. In the second embodiment of the present disclosure, the material of the carrier supply layer 430 is gallium nitride (GaN), and the thickness of the carrier supply layer 430 is 20 nm. In other embodiments of the present disclosure, the material of the carrier supply layer is InGaN, AlGaN, or AlInGaN. The carrier supply layer 430, for example, is a single layer structure.

The dopant in the carrier supply layer 430 includes the first type dopant and a second type dopant, and the doping concentration of the first type dopant is greater than the doping concentration of the second type dopant in the carrier supply layer 430. In the second embodiment of the present disclosure, the carrier supply layer 430 is a N-type semiconductor layer, and the first type dopant is Si, and the second type dopant is Mg, but the present disclosure is not limited thereto. In the second embodiment of the present disclosure, the doping concentration of the first type dopant in the carrier supply layer 430 ($C_C$) is greater than the doping concentration of the first type dopant in the heavily doped part 411 ($C_H$). In detail, the doping concentration of the first type dopant in the carrier supply layer 430 ($C_C$) is greater than $10^{18}$ atoms/cm$^3$, and $C_C$ is smaller than or equal to $10^{20}$ atoms/cm$^3$ in the second embodiment of the present disclosure. Preferably, in other embodiments of the present disclosure, $C_C$ is greater than $10^{18}$ atoms/cm$^3$, and $C_C$ is smaller than or equal to $10^{19}$ atoms/cm$^3$. The doping concentration of the second type dopant in the carrier supply layer 430 is smaller than $10^{18}$ atoms/cm$^3$. In other embodiments of the present disclosure, the carrier supply layer is only doped by the first type dopant. Since $C_C$ is greater than $C_H$, the number of the carriers in the first type semiconductor layer 400 is increased by the carrier supply layer 430 so that the emission intensity of the light emitting layer 300 is further increased.

The current diffusion layer 440 is disposed at the side of the second semiconductor sublayer 420 away from the first semiconductor sublayer 410. The material of the current diffusion layer 440 is, for example, $Al_rIn_sGa_{1-r-s}N$, where r≥0, s≥0 and 1≥r+s≥0, and the thickness of the current diffusion layer 440 is, for example, from 1 μm to 3 μm, but the present disclosure is not limited thereto. The doping concentration of the first type dopant in the current diffusion layer 440 ($C_C$) is different from the doping concentration of the first type dopant in the second semiconductor sublayer 420 ($C_S$). The doping concentration ($C_C$) of the first type dopant in most part of the current diffusion layer 440 is, for example, greater than the doping concentration of the first type dopant in the second semiconductor sublayer 420 ($C_S$). In the second embodiment of the present disclosure, the material of the current diffusion layer 440 is GaN, and the current diffusion layer 440 is a N-type semiconductor layer with the thickness of 2 μm but the present disclosure is not limited thereto. Also, the second type dopant is Si, and the doping concentration of the second type dopant is greater than $10^{19}$ atoms/cm$^3$, but the present disclosure is not limited thereto.

In the second embodiment of the present disclosure, the current diffusion layer 440 is disposed between the first electrode 100 and the second semiconductor sublayer 420, but the present disclosure is not limited thereto. In other embodiments of the present disclosure, the first electrode and the second semiconductor sublayer are disposed at the same side of the current diffusion layer. With the help of the current diffusion layer 440, the current entering the current diffusion layer 440 from the first electrode 100 is distributed in the first type semiconductor layer 400 more evenly so that the emission uniformity of the light emitting layer 300 is improved.

In the second embodiment of the present disclosure, the first type dopant in the first semiconductor sublayer 410, the second semiconductor sublayer 420, the carrier supply layer 430, and the current diffusion layer 440 are Si, but the present disclosure is not limited thereto. In other embodiments of the present disclosure, the first type dopant in the first semiconductor sublayer, the second semiconductor sublayer, the carrier supply layer, and the current diffusion layer are different kinds of dopants, and the first type dopant is Si or C.

The great amount of dopant in the second semiconductor sublayer 420 and the current diffusion layer 440 interferes the lattice orientation of the second semiconductor sublayer 420 and the current diffusion layer 440 so that the stress is accumulated in the lattice of the second semiconductor sublayer 420 and the lattice of the current diffusion layer 440. Since the great doping concentration difference between the heavily doped part 411 and the lightly doped part 412 in the first semiconductor sublayer 410, the interference in the lattice orientation of the lightly doped part 412 caused by the dopant is less than the interference in the lattice orientation of the heavily doped part 411 caused by the dopant. As a result, the stress accumulated in the lattice of the lightly doped part 412 is less than the stress accumulated in the lattice of the heavily doped part 411.

The stress accumulated in the second semiconductor sublayer 420 and the current diffusion layer 440 is buffered and released in the lightly doped part 412 of the first semiconductor sublayer 410 so as to prevent the great amount of stress being continuously accumulated in the carrier supply layer 430 and the light emitting layer 300. The higher the ratio of the thickness of the lightly doped part 412 to the thickness of the first semiconductor sublayer 410 is, the better the stress buffering and releasing effect of the lightly doped part 412 is. By disposing the lightly doped part 412 in the first semiconductor sublayer 410, defects resulted from the stress accumulation in the light emitting layer 300 is reduced. Therefore, the emission uniformity, the emission intensity, and the breakdown voltage of the light emitting device 2 are improved, and the current leakage of the light emitting device 2 is reduced, so that the general electrical performance and the reliability of the light emitting device are improved.

The second type semiconductor layer 500 is disposed at a side of the light emitting layer 300 away from the first type semiconductor layer 400. The material of the second type semiconductor layer 500 includes III-V nitrides such as gallium nitride (GaN), aluminum nitride (AlN) indium nitride (InN), indium gallium nitride (InGaN), aluminum gallium nitride (AlGaN), or indium gallium aluminum nitride (AlInGaN). The material of the second type semiconductor layer 500 in the second embodiment of the present disclosure is gallium nitride (GaN) or aluminum gallium nitride (AlGaN). In the second embodiment of the present disclosure, the second type semiconductor layer 500 is a P-type semiconductor layer, and the second type dopant is magnesium, and the doping concentration of the second type dopant is from $10^{19}$ atoms/cm$^3$ to $10^{20}$ atoms/cm$^3$, but the present disclosure is not limited thereto. In the second embodiment of the present disclosure, the second electrode 200 is disposed at a side of the second type semiconductor layer 500 away from the light emitting layer 300, but the present disclosure is not limited thereto.

The epitaxial structure is disposed on the buffer layer 700 located on the substrate 600 by a semiconductor manufacturing process The stacking sequence of the substrate 600, the buffer layer 700, and the epitaxial structure is illustrated in FIG. 5. In detail, the second semiconductor sublayer 420, the first semiconductor sublayer 410, the carrier supply layer 430, the light emitting layer 300, and the second type semiconductor layer 500 are disposed on a side of the buffer layer 700 away from the substrate 600 in sequence so as to obtain the epitaxial structure in the second embodiment of the present disclosure.

The material of the substrate 600 is, for example, sapphire, silicon, silicon carbide, glass, ceramic, other materials which have the lattice structure matched with the lattice structure of the buffer layer 700, but the present disclosure is not limited thereto. In other embodiments of the present disclosure, when the lattice structure of the substrate and the lattice structure of the current diffusion layer are matched with each other, directly forming the current diffusion layer on the substrate becomes available.

The buffer layer 700 is disposed at a surface of the substrate 600. The material of the buffer layer 700 is, for example, undoped gallium nitride (GaN), but the present disclosure is not limited thereto. The buffer layer 700 made by the undoped GaN means that there is no doping process applied on the buffer layer made by GaN in the recipe. The lattice matches between the lattice structure of the buffer layer 700 and the lattice structure of the substrate 600 and between the lattice structure of the buffer layer 700 and the lattice structure of the current diffusion layer 440 are both higher than the lattice match between the lattice structure of the substrate 600 and the lattice structure of the current diffusion layer 440. Therefore, the lattice orientation of the current diffusion layer 440 becomes more orderly, and the number of the defects in the current diffusion layer 440 is reduced so that current distributed in the current diffusion layer 440 becomes more evenly. In an embodiment of the present disclosure which is not shown in the figures, there is a nucleation layer, which has the lattice structure matched with the lattice structure of the substrate 600, disposed between the buffer layer 700 and the substrate 600. The nucleation layer is made by, for example, undoped aluminum nitride so that the lattice orientation of the subsequently formed epitaxial structure becomes more orderly.

In the light emitting device 2 of the second embodiment of the present disclosure, the first type semiconductor layer 400 is the N-type semiconductor layer, and the doping concentration of the dopant in the first type semiconductor layer 400 is the concentration of the N-type dopant; the second type semiconductor layer 500 is the P-type semiconductor layer; the first electrode 100 is the N-type electrode, and the second electrode 200 is the P-type electrode, but the present disclosure is not limited thereto. In the light emitting device of other embodiments of the present disclosure, the first type semiconductor layer is a P-type semiconductor layer, and the doping concentration of the dopant in the first type semiconductor layer is the concentration of the P-type dopant; the second type semiconductor layer is a N-type semiconductor layer; the first electrode is a P-type electrode, and the second electrode is a N-type electrode.

Figure 6:
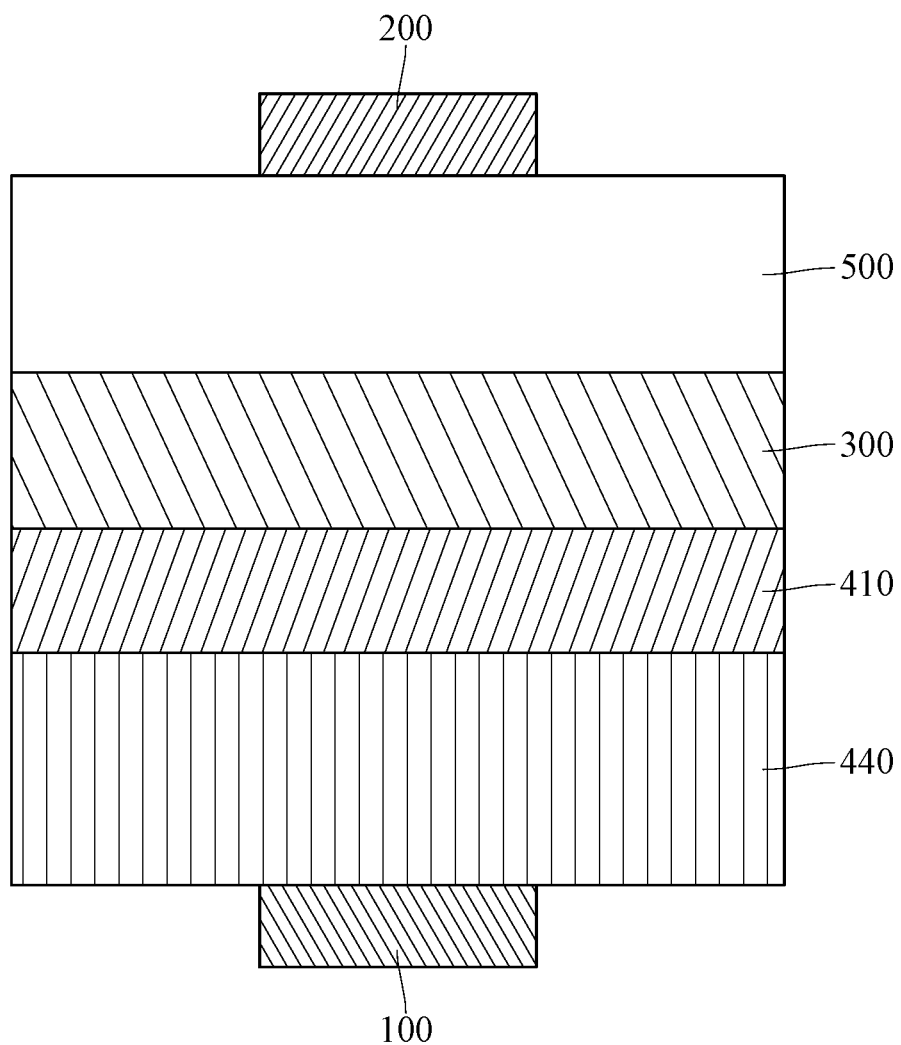
FIG. 6 is a cross-sectional view of a light emitting device in a third embodiment of the present disclosure.

The following illustrates the light emitting device 3 in the third embodiment of the present disclosure. Please refer to FIG. 6, FIG. 6 is a cross-sectional view of a light emitting device in a third embodiment of the present disclosure. The light emitting device 3 in the third embodiment of the present disclosure is similar to the light emitting device 2 in the second embodiment of the present disclosure, but there is no second semiconductor sublayer and carrier supply layer in the light emitting device 3 of the third embodiment of the present disclosure.

In detail, the light emitting device 3 in the third embodiment of the present disclosure is a vertical light emitting device. The light emitting device 3 includes a first electrode 100, a second electrode 200, a light emitting layer 300 disposed between the first electrode 100 and the second electrode 200, a first semiconductor sublayer 410 disposed between the first electrode 100 and the light emitting layer 300, a current diffusion layer 440 disposed between the first electrode 100 and the first semiconductor sublayer 410, and a second type semiconductor layer 500 disposed between the second electrode 200 and the light emitting layer 300.

Figure 7:
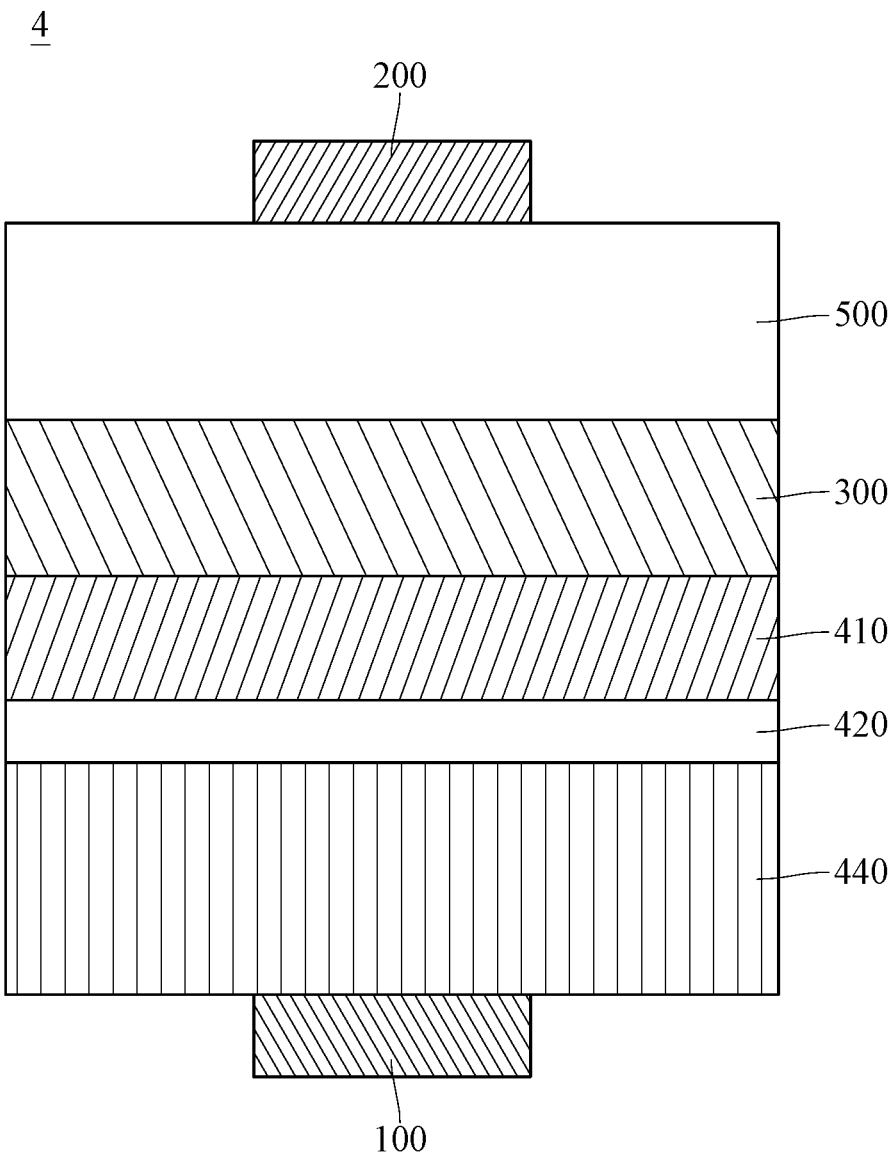
FIG. 7 is a cross-sectional view of a light emitting device in a fourth embodiment of the present disclosure.

The following illustrates the light emitting device 4 in the fourth embodiment of the present disclosure. Please refer to FIG. 7, FIG. 7 is a cross-sectional view of a light emitting device in a fourth embodiment of the present disclosure. The light emitting device 4 in the fourth embodiment of the present disclosure is similar to the light emitting device 2 in the second embodiment of the present disclosure, but there is no carrier supply layer in the light emitting device 4 of the fourth embodiment of the present disclosure.

In detail, the light emitting device 4 in the fourth embodiment of the present disclosure is a vertical light emitting device. The light emitting device 4 includes a first electrode 100, a second electrode 200, a light emitting layer 300 disposed between the first electrode 100 and the second electrode 200, a first semiconductor sublayer 410 disposed between the first electrode 100 and the light emitting layer 300, a second semiconductor sublayer 420 disposed between the first electrode 100 and the first semiconductor sublayer 410, a current diffusion layer 440 disposed between the first electrode 100 and the second semiconductor sublayer 420, and a second type semiconductor layer 500 disposed between the second electrode 200 and the light emitting layer 300.

Figure 8:
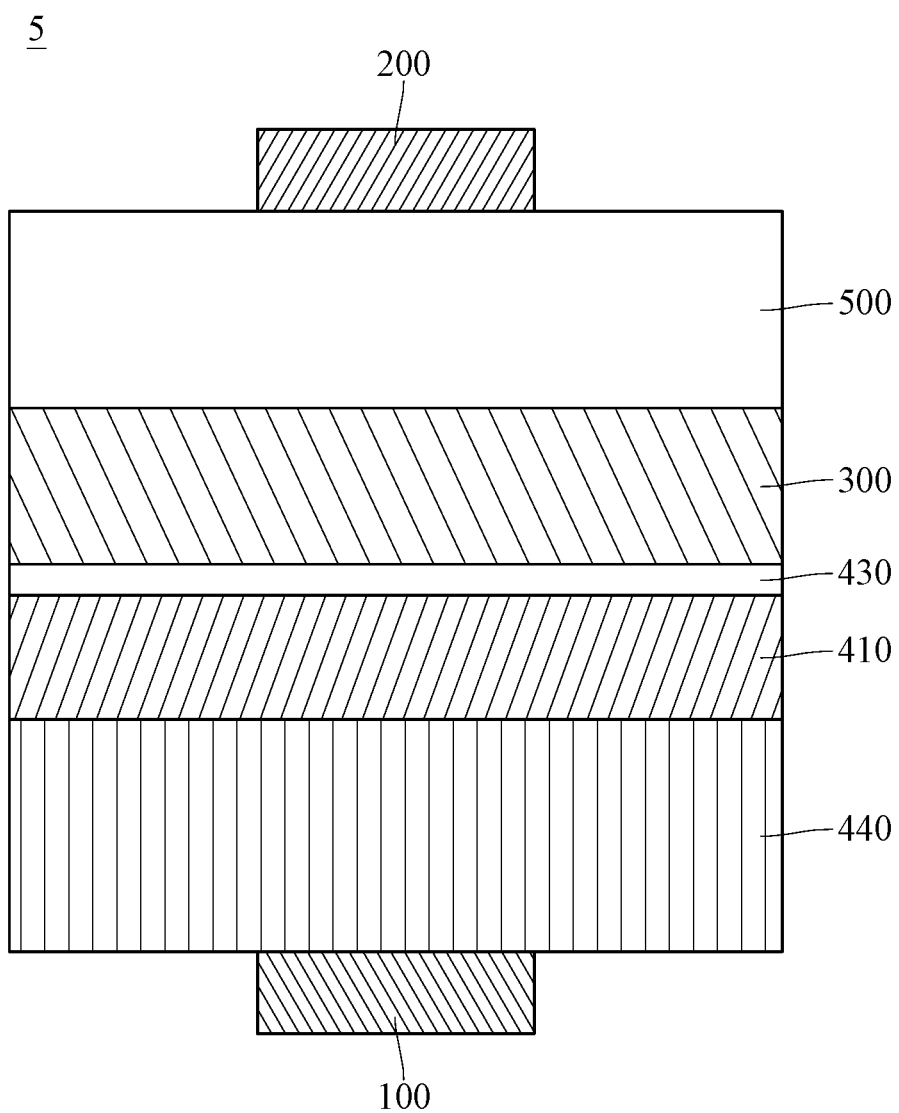
FIG. 8 is a cross-sectional view of a light emitting device in a fifth embodiment of the present disclosure.

The following illustrates the light emitting device 5 in the fifth embodiment of the present disclosure. Please refer to FIG. 8, FIG. 8 is a cross-sectional view of a light emitting device in a fifth embodiment of the present disclosure. The light emitting device 5 in the fifth embodiment of the present disclosure is similar to the light emitting device 2 in the second embodiment of the present disclosure, but there is no second semiconductor sublayer in the light emitting device 5 of the fifth embodiment of the present disclosure.

In detail, the light emitting device 5 in the fifth embodiment of the present disclosure is a vertical light emitting device. The light emitting device 5 includes a first electrode 100, a second electrode 200, a light emitting layer 300 disposed between the first electrode 100 and the second electrode 200, a first semiconductor sublayer 410 disposed between the first electrode 100 and the light emitting layer 300, a carrier supply layer 430 disposed between the light emitting layer 300 and the first semiconductor sublayer 410, a current diffusion layer 440 disposed between the first electrode 100 and the first semiconductor sublayer 410, and a second type semiconductor layer 500 disposed between the second electrode 200 and the light emitting layer 300.

Figure 9:
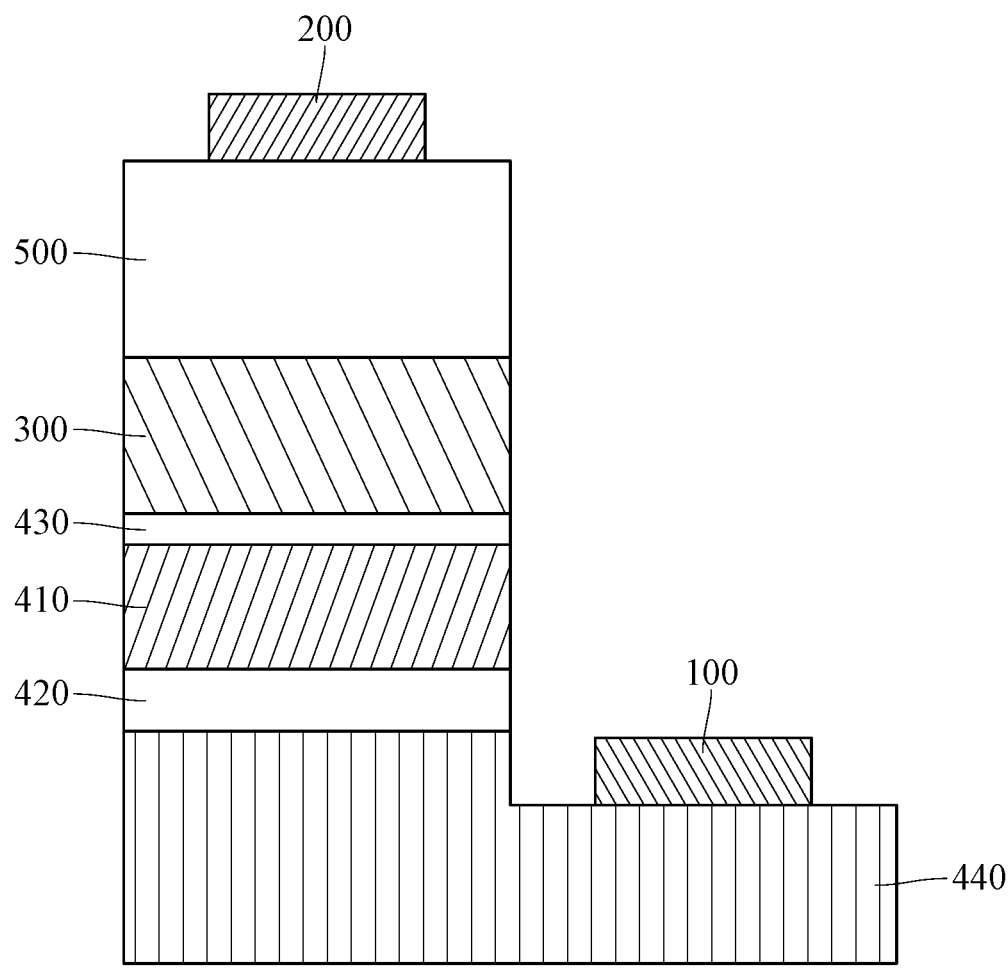
FIG. 9 is a cross-sectional view of a light emitting device in a sixth embodiment of the present disclosure.

The following illustrates the light emitting device 6 in the sixth embodiment of the present disclosure. Please refer to FIG. 9, FIG. 9 is a cross-sectional view of a light emitting device in a sixth embodiment of the present disclosure. The light emitting device 6 in the sixth embodiment of the present disclosure is similar to the light emitting device 2 in the second embodiment of the present disclosure.

In detail, the light emitting device 6 in the sixth embodiment of the present disclosure is a lateral light emitting device. The light emitting device 6 includes a current diffusion layer 440, a second type semiconductor layer 500, a light emitting layer 300 disposed between the current diffusion layer 440 and the second type semiconductor layer 500, a first semiconductor sublayer 410 disposed between the current diffusion layer 440 and the light emitting layer 300, a second semiconductor sublayer 420 disposed between the current diffusion layer 440 and the first semiconductor sublayer 410, a carrier supply layer 430 disposed between the light emitting layer 300 and the first semiconductor sublayer 410, a first electrode 100 connected to the current diffusion layer 440, and a second electrode 200 connected to the second type semiconductor layer 500. The first electrode 100 and the second semiconductor sublayer 420 are disposed at the same side of the current diffusion layer 440. Specifically, the second semiconductor sublayer 420 is disposed at and overlaps a part of a surface of the current diffusion layer 440 facing the light emitting layer 300, and the first electrode 100 is disposed and overlaps another part of the surface of the current diffusion layer 440 facing the light emitting layer 300.

Figure 10:
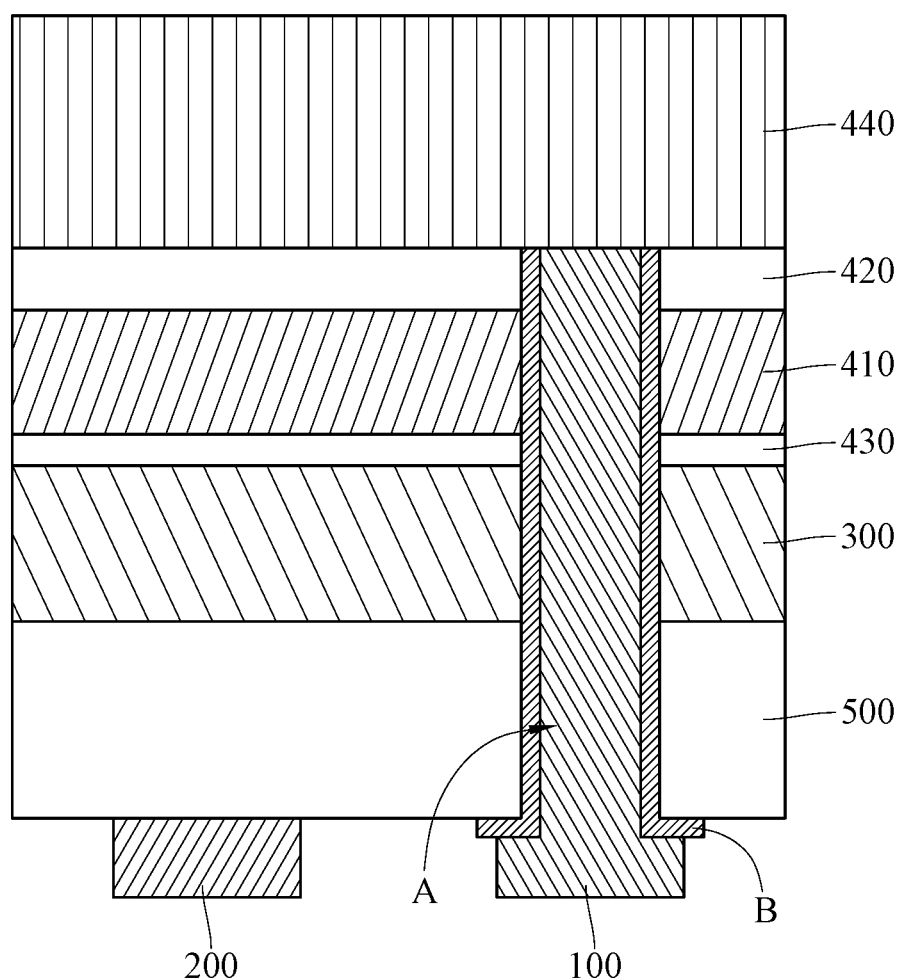
FIG. 10 is a cross-sectional view of a light emitting device in a seventh embodiment of the present disclosure.

The following illustrates the light emitting device 7 in the seventh embodiment of the present disclosure. Please refer to FIG. 10, FIG. 10 is a cross-sectional view of a light emitting device in a seventh embodiment of the present disclosure. The light emitting device 7 in the seventh embodiment of the present disclosure is similar to the light emitting device 2 in the second embodiment of the present disclosure.

The light emitting device 7 includes a current diffusion layer 440, a second type semiconductor layer 500, a light emitting layer 300 disposed between the current diffusion layer 440 and the second type semiconductor layer 500, a first semiconductor sublayer 410 disposed between the current diffusion layer 440 and the light emitting layer 300, a second semiconductor sublayer 420 disposed between the current diffusion layer 440 and the first semiconductor sublayer 410, a carrier supply layer 430 disposed between the light emitting layer 300 and the first semiconductor sublayer 410, a first electrode 100 connected to the current diffusion layer 440, and a second electrode 200 connected to the second type semiconductor layer 500. The first electrode 100 and the second semiconductor sublayer 420 are disposed at the same side of the current diffusion layer 440.

In detail, the epitaxial structure has a through hole A penetrating through the second semiconductor sublayer 420, the first semiconductor sublayer 410, the carrier supply layer 430, the light emitting layer 300, and the second type semiconductor layer 500. The current diffusion layer 440 is disposed in the through hole A. An insulating layer B is disposed at a side surface of the through hole A. The material of the insulating layer B is, for example, dielectric thin film or polymer. For instance, the insulating layer B is made by $Al_2O_3$, $SiO_2$, $Si_3N_4$ or a combination thereof. Specifically, the young's modulus of the material which the insulating layer B is made by is smaller than the young's modulus of the materials which the epitaxial structure, the first electrode 100, and the second electrode 200 are made by. Therefore, when binding the light emitting device 7 to an application device such as a display panel (not shown in the figures) in the subsequent binding process, the insulating material with greater deformability act as the buffer of the binding process. The first electrode 100 is disposed at and electrically connected to the current diffusion layer 440 which is exposed in the through hole A. The first electrode 100 penetrates through the second semiconductor sublayer 420, the first semiconductor sublayer 410, the carrier supply layer 430, the light emitting layer 300, and the second type semiconductor layer 500. The first electrode 100 is electrically insulated to the second semiconductor sublayer 420, the first semiconductor sublayer 410, the carrier supply layer 430, the light emitting layer 300, and the second type semiconductor layer 500 by the insulating layer B.

According to the light emitting device in the present disclosure, the stress accumulation in the epitaxial structure is reduced by the great doping concentration difference between the heavily doped part and the lightly doped part, and the accumulated stress in the first type semiconductor layer is buffered and released in the lightly doped part; therefore, the continuous stress accumulation in the light emitting layer is prevented. Accordingly, the number of the defects in the light emitting layer, which is resulted from the stress accumulation, is reduced. As a result, the emission uniformity, the emission intensity, and the breakdown voltage of the light emitting layer are improved, and the current leakage of the light emitting device is reduced so that the general electrical performance and the reliability of the light emitting device are improved.

What is claimed is:

1. A light emitting device, comprising:
an epitaxial structure comprising:
a first type semiconductor layer comprising a first semiconductor sublayer;
a second type semiconductor layer; and
a light emitting layer disposed between the first type semiconductor layer and the second type semiconductor layer;
wherein, the first semiconductor sublayer has a heavily doped part and a lightly doped part which are doped by a first type dopant, the lightly doped part is disposed between the light emitting layer and the heavily doped part, a doping concentration of the first type dopant in the heavily doped part is between $10^{17}$ atoms/cm$^3$ and $10^{18}$ atoms/cm$^3$, and a doping concentration of the first type dopant in the lightly doped part is less than or equal to $10^{16}$ atoms/cm$^3$,
wherein the first semiconductor sublayer is a single layer, in an image of an electron microscope or a secondary ion mass spectrometry, the heavily doped part and the lightly doped part of the first semiconductor sublayer show consistent grayscale level.

2. The light emitting device according to claim 1, wherein a ratio of the doping concentration of the first type dopant in the heavily doped part to the doping concentration of the first type dopant in the lightly doped part is greater than 10.

3. The light emitting device according to claim 1, wherein a thickness of the first semiconductor sublayer is from 50 nanometers to 250 nanometers.

4. The light emitting device according to claim 3, wherein a ratio of a thickness of the lightly doped part to the thickness of the first semiconductor sublayer is from 0.1 to 0.95.

5. The light emitting device according to claim 4, wherein the ratio of the thickness of the lightly doped part to the thickness of the first semiconductor sublayer is from 0.6 to 0.95.

6. The light emitting device according to claim 1, wherein the first semiconductor sublayer is made of a ternary semiconductor material.

7. The light emitting device according to claim 6, wherein the ternary semiconductor material is indium gallium nitride (InGaN).

8. The light emitting device according to claim 1, wherein the first type semiconductor layer further comprises a second semiconductor sublayer which is doped by the first type dopant, the first semiconductor sublayer is disposed between the light emitting layer and the second semiconductor sublayer, a doping concentration of the first type dopant in the second semiconductor sublayer is greater than the doping concentration of the first type dopant in the heavily doped part.

9. The light emitting device according to claim 8, wherein the doping concentration of the first type dopant in the second semiconductor sublayer is equal to $10^{20}$ atoms/cm$^3$ or between $10^{18}$ atoms/cm$^3$ and $10^{20}$ atoms/cm$^3$.

10. The light emitting device according to claim 8, wherein a thickness of the second semiconductor sublayer is from 50 nanometers to 100 nanometers.

11. The light emitting device according to claim 8, wherein the second semiconductor sublayer is made of $Al_rIn_sGa_{1-r-s}N$, where r≥0, s≥0 and 1≥r+s≥0.

12. The light emitting device according to claim 11, wherein the second semiconductor sublayer is made of gallium nitride (GaN).

13. The light emitting device according to claim 1, wherein the first type semiconductor layer further comprises a carrier supply layer which is doped by the first type dopant, the carrier supply layer is disposed between the light emitting layer and the first semiconductor sublayer, and a doping concentration of the first type dopant in the carrier supply layer is greater than the doping concentration of the first type dopant in the heavily doped part.

14. The light emitting device according to claim 13, wherein the doping concentration of the first type dopant in the carrier supply layer is equal to $10^{20}$ atoms/cm$^3$ or between $10^{18}$ atoms/cm$^3$ and $10^{20}$ atoms/cm$^3$.

15. The light emitting device according to claim 13, wherein a thickness of the carrier supply layer is from 10 nanometers to 30 nanometers.

16. The light emitting device according to claim 13, wherein the carrier supply layer is made of $Al_rIn_sGa_{1-r-s}N$, where r≥0, s≥0 and 1≥r+s≥0.

17. The light emitting device according to claim 16, wherein the carrier supply layer is made of GaN.

18. The light emitting device according to claim 13, wherein the carrier supply layer includes the first type dopant and a second type dopant, the first type dopant is a N-type dopant, the second type dopant is a P-type dopant, and the doping concentration of the first type dopant in the carrier supply layer is greater than a doping concentration of the second type dopant in the carrier supply layer.

19. The light emitting device according to claim 1, further comprising:
a first electrode; and
a second electrode;
wherein, the epitaxial structure is disposed between the first electrode and the second electrode, the first type semiconductor layer is disposed between the light emitting layer and the first electrode, the first type semiconductor layer further comprises a current diffusion layer disposed between the first semiconductor sublayer and the first electrode.

20. The light emitting device according to claim 1, wherein the first type dopant is a N-type dopant.

21. The light emitting device according to claim 1, wherein a thickness of the epitaxial structure is less than or equal to 6 micrometers.

22. The light emitting device according to claim 1, wherein the doping concentration of the first type dopant in the lightly doped part is less than or equal to $10^{16}$ atoms/cm$^3$.

23. The light emitting device according to claim 1, wherein a defect concentration in the light emitting layer is from $10^4$/cm$^2$ to $10^8$/cm$^2$.

24. The light emitting device according to claim 1, wherein the lightly doped part approaches undoped.

25. The light emitting device according to claim 1, wherein the first type semiconductor layer further comprises a second semiconductor sublayer which is doped by the first type dopant, the heavily doped part is disposed between the second semiconductor sublayer and the lightly doped part.

* * * * *